United States Patent
Leung et al.

(10) Patent No.: US 7,545,900 B2
(45) Date of Patent: Jun. 9, 2009

(54) LOW JITTER AND/OR FAST LOCK-IN CLOCK RECOVERY CIRCUIT

(75) Inventors: Ho-Ming Leung, Cupertino, CA (US); Nasima Parveen, San Jose, CA (US); Ka-Shu Ko, San Ramon, CA (US)

(73) Assignee: LSI Corporation, Milpitas, CA (US)

( * ) Notice: Subject to any disclaimer, the term of this patent is extended or adjusted under 35 U.S.C. 154(b) by 632 days.

(21) Appl. No.: 11/273,940

(22) Filed: Nov. 15, 2005

(65) Prior Publication Data
US 2007/0110206 A1    May 17, 2007

(51) Int. Cl.
*H03D 3/24* (2006.01)
(52) U.S. Cl. ............... 375/376; 375/375; 327/155; 327/156; 327/160
(58) Field of Classification Search ......... 375/371–376; 327/153–167
See application file for complete search history.

(56) References Cited

U.S. PATENT DOCUMENTS

| | | | | |
|---|---|---|---|---|
| 5,841,303 | A * | 11/1998 | Takashi et al. | 327/156 |
| 6,351,164 | B1 * | 2/2002 | Yoshie | 327/156 |
| 6,498,537 | B1 * | 12/2002 | Watanabe | 331/25 |
| 6,735,260 | B1 * | 5/2004 | Eliezer et al. | 375/316 |
| 2006/0008040 | A1 * | 1/2006 | Vallet et al. | 375/371 |
| 2007/0025490 | A1 * | 2/2007 | Azadet et al. | 375/376 |

* cited by examiner

*Primary Examiner*—Curtis B Odom
(74) *Attorney, Agent, or Firm*—Christopher P. Maiorana, PC

(57) ABSTRACT

An apparatus comprising an oscillator circuit, a control circuit, a counter circuit and a detector circuit. The oscillator circuit may be configured to generate an output signal oscillating at a particular frequency in response to a control signal. The control circuit may be configured to generate the control signal in response to a first error signal and a second error signal. The counter circuit may be configured to generate the first error signal in response to the output signal and an input signal. The detector circuit may be configured to generate the second error signal in response to the output signal and the input signal.

18 Claims, 5 Drawing Sheets

LOW JITTER AND/OR FAST LOCK-IN CLOCK RECOVERY CIRCUIT

FIELD OF THE INVENTION

The present invention relates to clock recovery generally and, more particularly, to a method and/or apparatus for implementing a low jitter and/or fast lock-in clock recovery circuit.

BACKGROUND OF THE INVENTION

Several conventional applications use clock recovery circuits in system on a chip (SOC) environments. Some examples include storage devices (i.e., optical disc and hard disc data retrieval) and serial data channels (i.e., USB, Firewire, serial ATAPI (SATA), etc.). In order to retrieve the data, the embedded data channel clock signal needs to be recovered and reconstructed from the incoming data. In conventional clock recovery systems, data bits are encoded in the data channel by transitions of the pulse edge using a format such as non return to zero (NRZ) or biphase encoding. Some serial data channel systems encode additional information, such as amplitude information, within the data channel. The additional information may be used either to increase data capacity or embedded some side band information. Such an implementation makes clock recovery more challenging since the recovered channel clock needs to have very low jitter in order to sample the data channel amplitude at a precise moment.

Conventional solutions to these problems include (i) using an external discrete clock recovery circuit, (ii) using a special (i.e., expensive) optical loader that presents a recovered clock, and (iii) using a third party PHY (e.g., SATA, USB etc.) chip.

Traditional data recovery circuitry uses a narrow band phase lock loop (PLL). A data channel edge transition does not occur on every clock cycle. Therefore, the PLL bandwidth is reduced so a clock edge without a data transition would not throw the PLL out of an expected operating range (i.e., the PLL behaves more like a "fly wheel" oscillating at the same channel clock frequency). Whenever there is no data transition, a conventional PLL jitters because the phase error increases or decreases the frequency of the voltage control oscillator (VCO) within the PLL. The PLL relies on the fact that eventually a valid data transition edge occurs to correct the frequency error and phase error. In order to "ride over" the bumps caused by error signals generated at the non-data transition edge, loop filters within PLLS are designed to have very low bandwidth. However, using a low bandwidth loop filter causes a PLL to have a very slow response time to any real change of the data channel frequency and phase, thus having jitter performance much lower than a regular PLL.

A traditional digital phase lock loop uses an independent system clock, which needs another oscillator. Also, an independent system clock has limited resolution and does not track with the frequency of the incoming channel clock, thus reducing performance.

It would be desirable to implement a method and/or apparatus for data recovery that has very low clock jitter allowing the data channel amplitude to be sampled at the precise moment.

SUMMARY OF THE INVENTION

The present invention concerns an apparatus comprising an oscillator circuit, a control circuit, a counter circuit and a detector circuit. The oscillator circuit may be configured to generate an output signal oscillating at a particular frequency in response to a control signal. The control circuit may be configured to generate the control signal in response to a first error signal and a second error signal. The counter circuit may be configured to generate the first error signal in response to the output signal and an input signal. The detector circuit may be configured to generate the second error signal in response to the output signal and the input signal.

The objects, features and advantages of the present invention include providing a method and/or apparatus for implementing a clock recovery circuit that may (i) provide a low jitter recovered channel clock, (ii) have a fast lock-in time, (iii) have high bandwidth that may be used in an optical data storage system in either constant linear velocity (CLV) mode or constant angular velocity (CAV) mode, (iv) be implemented with a traditional SOC process, (v) be implemented without the need for high precision components such as thin film capacitor, (vi) be implemented with a traditional voltage control oscillator (VCO) circuit and operation amplifier, (vii) use a traditional VCO, but also generates an oversampling clock to drive digital phase detector and digital pulse width measuring logic, (viii) use a data slicer with low precision requirement, (ix) be implemented without a slicer if the input data channel is a digital waveform (rather than an RF waveform), (x) be implemented with a digital phase detector, (xi) be implemented with a phase detector that only generates an error signal when there is data transition edge (e.g., the PLL would not be disturbed when there is no data transition), (xi) use a direct data channel pulse width measuring digital logic, (xii) intelligently turn on/off phase error gain, (xiii) implement frequency lock that is established first, then phase lock circuitry with a very high gain factor that would then be activated and/or (xiv) and has separate programmable frequency error gain for error at maximum pulse width and for error at minimum pulse width, which is important to lower the jitter of the overall system.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
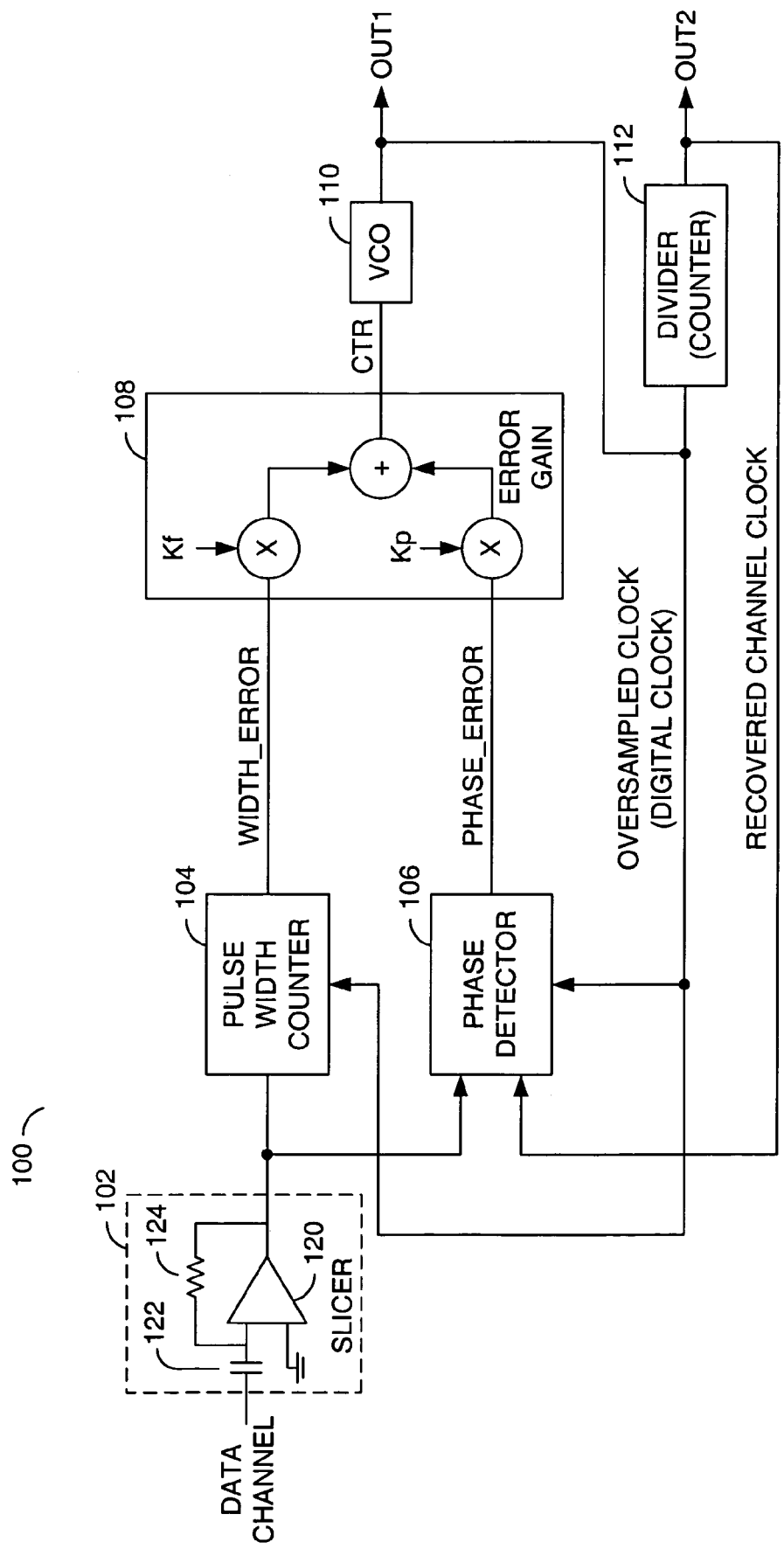
FIG. 1 is a block diagram of the present invention.

Referring to FIG. 1, a diagram of a circuit 100 is shown in accordance with a preferred embodiment of the present invention. The circuit 100 may be implemented as a clock recovery circuit. The circuit 100 generally comprises a block (or circuit) 102, a block (or circuit) 104, a block (or circuit) 106, a block (or circuit) 108, a block (or circuit) 110 and a block (or circuit) 112. The circuit 102 may be implemented as a slicer circuit. The circuit 104 may be implemented as a pulsewidth counter circuit. The circuit 106 may be implemented as a phase detector circuit. The circuit 108 may be implemented as an error gain circuit. The circuit 110 may be implemented as a voltage controlled oscillator circuit. The circuit 112 may be implemented as a divider circuit.

The slicer circuit 102 may receive an input signal (e.g., DATA_CHANNEL). The signal DATA_CHANNEL may be an input signal that includes data and an embedded clock signal. The slicer circuit 102 may couple the signal DATA_CHANNEL to the pulse width counter circuit 104 and the phase detector 106. The pulse width counter circuit 104 may generate a signal (e.g., WIDTH_ERROR). The phase detector circuit 106 may generate a signal (e.g., PHASE_ERROR). The error gain circuit 108 may generate a signal (e.g., CTR) in response to the signal WIDTH_ERROR, the signal PHASE_ERROR, a factor signal (e.g., KF) and a factor signal (e.g., KV). The signal CTR may be a control signal. The oscillator 110 may generate an output signal (e.g., OUT1) that oscillates at a particular frequency in response to the signal CTR. The signal OUT1 may be an oversampled clock signal that may be presented to the pulse width counter circuit 104 and the phase detector 106. The divider circuit 112 may divide the signal OUT1 to generate a signal (e.g., OUT2). The signal OUT2 may be a recovered channel clock signal (e.g., CHANNEL_CLOCK).

The slicer 102 may be implemented as an optional circuit that may only be needed in certain applications. For example, the slicer 102 may be needed if the input data signal DATA_CHANNEL is an RF (radio frequency) signal, such as a signal from an optical disc or a hard disc. If the input data is digital, such as a signal from a USB device, then the slicer 102 may not be needed.

The slicer 102 may be implemented in a variety of ways. The basic operation of the slicer 102 is to remove the DC component of the signal DATA_CHANNEL. In one example, the slicer 102 may be implemented as a high pass filter followed by a schmitt trigger. For example, the slicer 102 may be implemented as an operational amplifier 120, a capacitor 122, and a resistor 124. Other passive components may also be implemented. In one example, the slicer 102 may be implemented on the same integrated circuit as the circuit 100. In another example, the slicer may be implemented on a separate integrated circuit (e.g., off chip) from the circuit 100. An off-chip implementation of the slicer 102 may have minimal impact on the bill of material cost since operational amplifiers are inexpensive.

Normally, the input signal DATA_CHANNEL may have certain characteristics that may be used to measure the frequency error. For example, in a DVD disc, a channel clock period is normally denoted as 'T'. The minimum pulse width of the data channel is 3T while the maximum pulsewidth is 14T. The pulse width counter 104 may be implemented as a frequency detector, which uses the oversampled clock signal OUT1 to measure the width of the shortest pulse and the width of the longest pulse. The pulse width counter may be implemented as a simple counter, which counts the width of each pulse of the signal DATA_CHANNEL. However, other methods for pulse width detection may be implemented. One example would be to use a 8× oversampled clock generated from the VCO 110. In the case of a DVD disc, the shortest input pulse would have a count value of 8*3=24 clocks. The longest pulse width in a DVD disc would be 14*8=112 clock pulses.

The pulse width counter 104 generates the signal WIDTH_ERROR. The signal WIDTH_ERROR may be a digital signal that counts the clock shortage or clock excess. For example, if the data width of the signal DATA_CHANNEL was found to have only 22 clocks, then a −2 value would be generated. On the other hand, if the data width of the signal DATA_CHANNEL was found to be 114 clocks, then a +2 value would be generated. Consider an example of an 8× oversampling. A 3 T pulse may be (3×8) 24 clock, and a 14T pulse may be (14×8) 112 clocks. An example of values of the signal WIDTH_ERROR for a minimum pulse width of 3T may be implemented as the following table:

| oversampled Clock Count | WIDTH_ERROR |
|---|---|
| 24 | 0 |
| 23 | −1 |
| 22 | −2 |
| 21 | −3 |
| 20 | −4 |

An example of values for the signal WIDTH_ERROR for a maximum pulse width of 14T may be implemented as follows:

| Oversampled Clock Count | WIDTH_ERROR |
|---|---|
| 112 | 0 |
| 113 | +1 |
| 114 | +2 |
| 115 | +3 |
| 116 | +4 |

Figure 2:
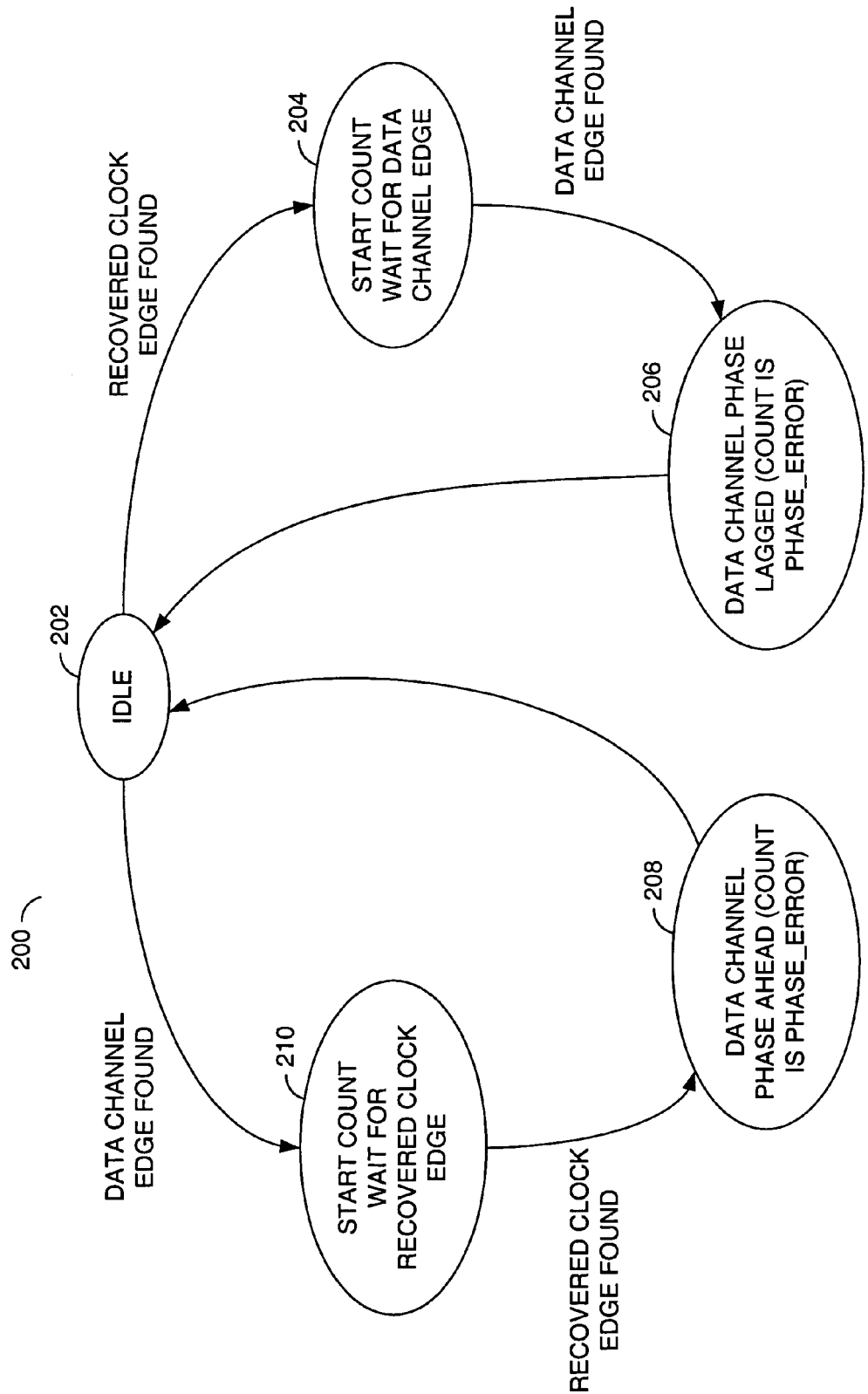
FIG. 2 is a diagram of a phase comparator state machine in accordance with the present invention.

The phase detector 106 may be implemented as a simple state machine, driven by the over-sampling clock. FIG. 2 illustrates a state machine 200 as an example of such an implementation. The state machine 200 generally comprises a state 202, a state 204, a state 206, a state 208 and a state 210. The state 202 may be an idle state. The state machine 202 may move to either the state 204 or the state 210. The state machine 200 moves to the state 204 if a recovered clock edge is found. The state machine 200 moves to the state 210 if a data channel edge is found. The state 204 generally starts a count signal and waits for a data channel edge. After the state 204, the state machine 200 moves to the state 206 when a data channel edge is found. The state 206 indicates that the data channel is phase lagged (e.g., the count value is PHASE_ERROR). Then the state machine 200 then moves back to the idle state 202. When in the state 210, the state machine 200 starts a count value and waits for a recovered clock edge. After a recovered clock edge is found, the state machine 200 moves to the state 208. The state 208 indicates that the data channel is phase advanced (or ahead). For example, the count value is PHASE_ERROR. Next, the state machine 200 moves back to the idle state 202.

Figure 3:
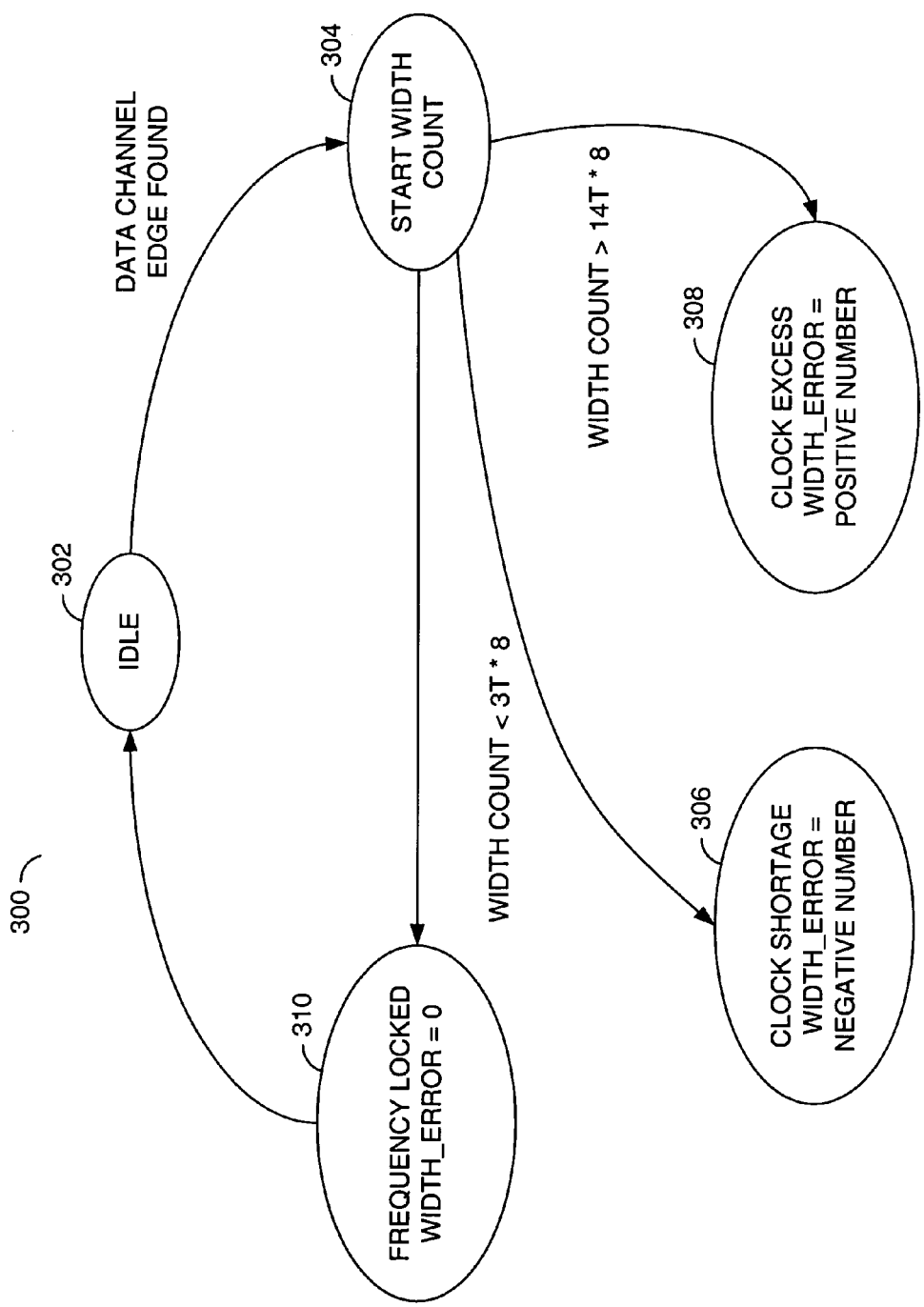
FIG. 3 is a diagram of a frequency comparator state machine in accordance with the present invention.

Referring to FIG. 3, a state machine 300 implementing a frequency comparator state machine for the block 104 is shown. The state machine 300 generally comprises a state 302, a state 304, a state 306, a state 308 and a state 310. The state 302 is an idle state. The state 302 waits for a data edge to be found, then moves to the state 304. The state 304 starts a width count value. If the width count is less than 3T×8, then the state machine 300 moves to the state 306. If the width count is greater than 14T×8, then the state machine 300 moves to the state 308. The state 306 indicates a clock shortage where the signal WIDTH_ERROR is a negative number. The state 308 indicates a clock excess, where the signal WIDTH_ERROR is a positive number. If the signal WIDTH_COUNT does not meet the two conditions described, the state machine 300 moves to the state 310, which indicates that the frequency is locked and the signal WIDTH_ERROR is equal to 0. A detection method may be implemented with the following conditions:

(i) if the signal CHANNEL_CLOCK (or signal OUT)=0 at a rising or falling edge of the signal DATA_CHANNEL, then the signal PHASE_ERROR=+(count between the rising edge of the signal CHANNEL_CLOCK and an edge of the signal DATA_CHANNEL edge), or (ii) If the signal CHANNEL_CLOCK does not equal 0 at a rising or falling edge of the signal DATA_CHANNEL, then the signal PHASE_ERROR=−(count between the edge on the signal DATA_CHANNEL and the rising edge of the signal CHANNEL_CLOCK).

Again, the number of clock counts between the channel clock signal OUT and signal DATA_CHANNEL may be measured by the counter 112 driven by the oversampled clock signal OUT2. The present invention has a lower jitter than a traditional "fly wheel" approach since the error signals WIDTH_ERROR and PHASE_ERROR are not generated where there is clock edge of the signal DATA_CHANNEL but no data edge.

The error count generated by the pulse width circuit (e.g., WIDTH_ERROR) or phase detector (e.g., PHASE_ERROR) are multiplied with the gain factor Kf or the gain factor Kp. The factor Kp may be a phase gain factor while the gain factor Kf may be a frequency gain factor. The gain factors Kp and Kf may be digital signals stored in registers that may be programmed by software. The characteristics (e.g., gain, jitter, etc.) of the clock recovery circuit 100 may be changed by programming the gain factor Kf and/or Kp. Also, separate programmable frequencies of the gain factor Kf may be implemented for a minimum pulse width and a maximum pulse width. The separate versions of the gain factor Kf may lead to lower jitter for the system 100.

In one example, for a low jitter operation, an aggressive gain factor Kp may be used so that the recovered channel clock signal OUT2 may be closely tracked with the input signal DATA_CHANNEL. However, an aggressive (or large) factor Kp may confuse the channel recovery operation and potentially cause difficulty establishing frequency lock. Such a condition may be solved by using a simple state machine that would turn the factor Kp to '0', then wait for frequency lock established first. Frequency lock may then be established if the pulse width error magnitude is smaller than certain predefined value (e.g., 2). In such a case, the gain factor Kp may be changed to the normal value by the state machine after the frequency lock has been established.

Figure 4:
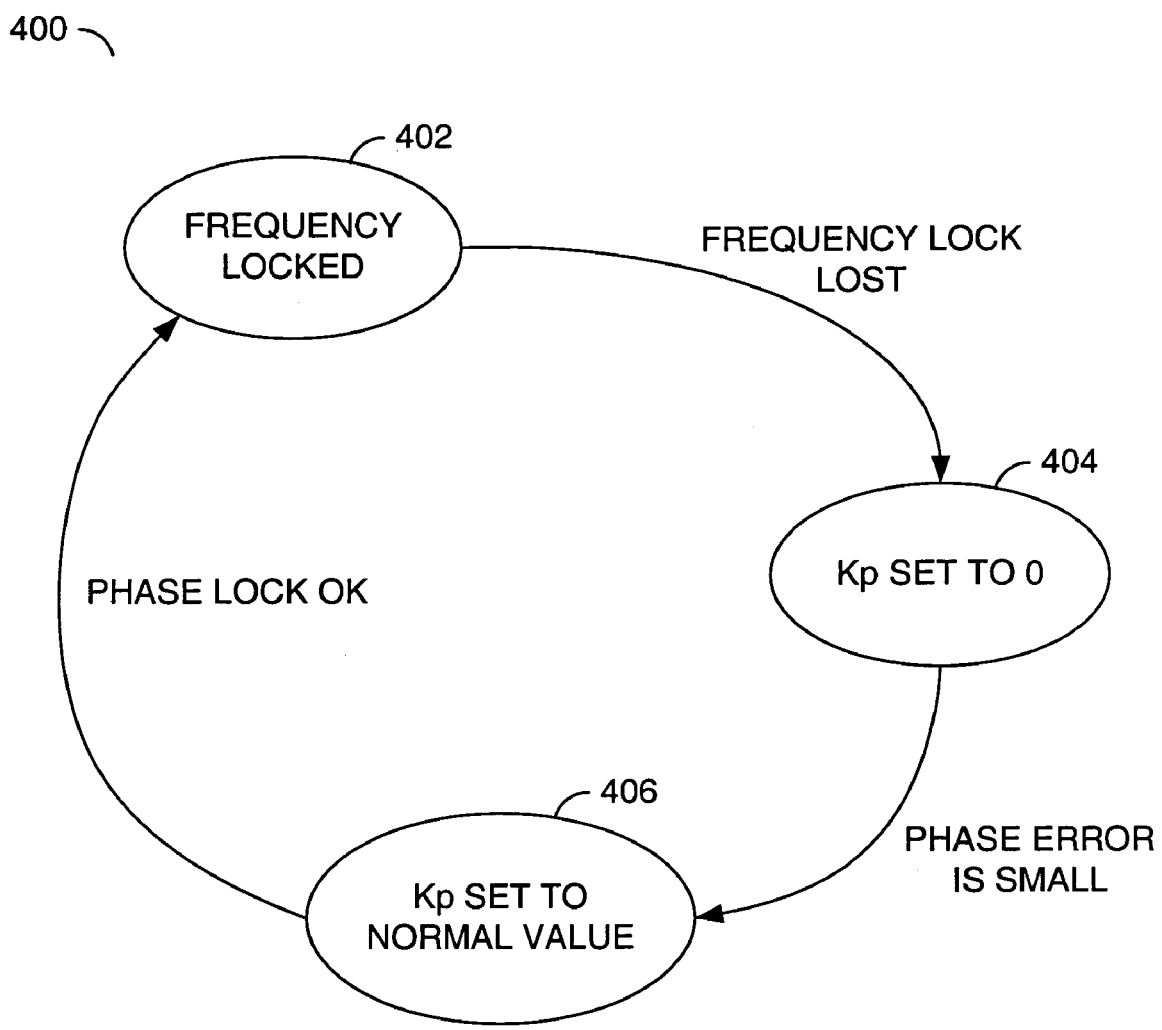
FIG. 4 is a diagram of an aggressive phase lock state machine.

Referring to FIG. 4, a state machine 400 is shown. The state machine 400 may implement an aggressive phase lock state machine. The state machine 400 generally comprises a state 402, a state 404 and a state 406. The state 402 generally indicates a phase locked condition. So long as the frequency is locked, the state machine 400 remains in the state 402. However, if the frequency lock is lost, the state machine 400 moves to the state 404. The state 404 sets the value Kp. If the phase error is small, the state machine moves to a state 406. The state 406 sets the value Kp to a normal value. If the phase lock is ok, then state machine 400 moves back to the frequency locked state 402.

The oscillator circuit 110 may be implemented as a variety of analog or digital circuits. One example may be implemented using a charge pump to either charge up or charge down the oscillator circuit 110. In one example, the oscillator circuit 110 may be digitally controlled by the error gain circuit. For example, if the output control signal CTR of the error gain block 108 is a positive number, then a positive charge would be injected to a charge storage capacitor which would increase the voltage of the charge storage capacitor. The amount of charge would be proportional to the error magnitude. On the other hand, if the output control signal CTR of the error gain block 108 is a negative number, then a negative charge would be injected to the charge storage capacitor which would decrease the voltage of the charge storage capacitor. The voltage of the charge capacitor would control the oscillating frequency.

In general, the phase detector 106 and the pulse width counter 104 run on the oversampled clock signal OUT1. The VCO 10 is actually oscillating on a much higher frequency than the channel clock signal OUT2. The clock divider 112 normally divides down and generates the final recovered channel clock.

Figure 5:
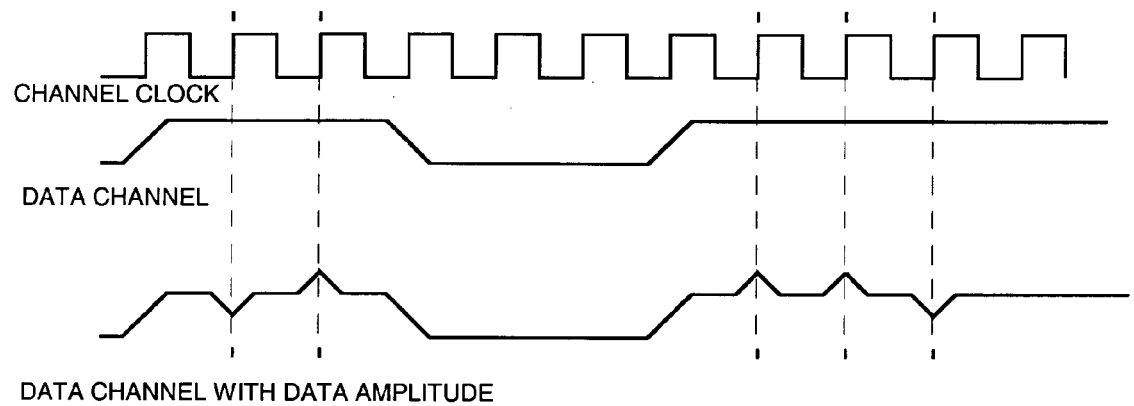
FIG. 5 is a timing diagram of the present invention.

Referring to FIG. 5, a timing diagram of the present invention is shown. FIG. 5 illustrates that the system 100 generally provides a very low clock jitter. Such a low jitter may allow the data channel amplitude to be sampled at a precise moment. For example, the amplitude of data on the signal DATA_CHANNEL may be precisely sampled at every rising edge of the signal CHANNEL_CLOCK.

The function performed by the state machines of FIGS. 2-4 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
   an oscillator circuit configured to generate an output signal oscillating at a particular frequency in response to a control signal;
   a control circuit configured to generate said control signal in response to (i) a first error signal, (ii) a second error signal, (iii) a first factor, and (iv) a second factor, wherein (i) said first factor and said second factor are programmable to control the operation of the apparatus, and (ii) said first factor is separately programmable when (a) said first error signal is at a maximum pulse width and (b) said first error signal is at a minimum pulse width;
   a counter circuit configured to generate said first error signal in response to said output signal and an input signal; and
   a detector circuit configured to generate said second error signal in response to said output signal and said input signal.

2. The apparatus according to claim 1, wherein said detector circuit provides an initial lock and said counter circuit provides a high gain factor lock after said initial lock.

3. The apparatus according to claim 1, further comprising:
a slicer circuit configured to remove a DC component of said input signal.

4. The apparatus according to claim 3, wherein said slicer is implemented as an integrated circuit along with said oscillator circuit, said control circuit, said counter circuit and said detector circuit.

5. The apparatus according to claim 3, wherein said slicer is implemented on a first integrated circuit and said oscillator circuit, said control circuit, said counter circuit and said detector circuit are implemented on a second integrated circuit.

6. The apparatus according to claim 1, further comprising:
a divider circuit configured to divide said frequency of said output signal to generate a second output signal presented to said detector circuit.

7. The apparatus according to claim 1, wherein said input signal comprises a data input signal.

8. The apparatus according to claim 1, wherein (i) said first error signal comprises a width error signal and (ii) said second error signal comprises a phase error signal.

9. The apparatus according to claim 8, wherein said control circuit is configured to (i) multiply said width error signal by said first factor to generate a multiplied error signal, (ii) multiply said phase error signal by said second factor to generate a multiplied phase error signal and (iii) add said multiplied width error signal and said multiplied phase error signal to generate said control signal.

10. The apparatus according to claim 1, wherein said output signal comprises an oversampled clock signal.

11. The apparatus according to claim 6, wherein said second output signal comprises a recovered channel clock signal.

12. The apparatus according to claim 1, wherein said oscillator circuit comprises a digital voltage controlled oscillator.

13. The apparatus according to claim 1, wherein said oscillator circuit comprises an analog voltage controlled oscillator.

14. An apparatus comprising:
means for generating an output signal oscillating at a particular frequency in response to a control signal;
means for generating said control signal in response to (i) a first error signal, (ii) a second error signal, (iii) a first factor, and (iv) a second factor, wherein (i) said first factor and said second factor are programmable to control the operation of the apparatus, and (ii) said first factor is separately programmable when (a) said first error signal is at a maximum pulse width and (b) said first error signal is at a minimum pulse width;
means for generating said first error signal in response to said output signal and an input signal; and
means for generating said second error signal in response to said output signal and said input signal.

15. A method for implementing a clock recover comprising the steps of:
(A) generating an output signal oscillating at a particular frequency in response to a control signal;
(B) generating said control signal in response to a first error signal and a second error signal;
(C) generating said first error signal in response to said output signal and an input signal;
(D) generating said second error signal in response to said output signal and said input signal;
(E) multiplying said first error signal by a first factor to generate a multiplied error signal;
(F) multiplying said second error signal by a second factor to generate a multiplied chase error signal;
(G) adding said multiplied error signal to said phase error signal to generate said control signal; and
(H) separately programming said first factor when (i) said first error signal is at a maximum pulse width and (ii) said first error signal is at a minimum pulse width.

16. The method according to claim 15, further comprising the steps of:
providing an initial lock; and
providing a high gain factor lock after providing said initial lock.

17. The method according to claim 15, further comprising the step of:
dividing said frequency of said output signal to generate a second output signal.

18. An apparatus comprising:
an oscillator circuit configured to generate an output signal oscillating at a particular frequency in response to a control signal;
a control circuit configured to generate said control signal in response to a width error signal and a phase error signal, wherein said control circuit is configured to (i) multiply a width error signal by a first factor to generate a multiplied error signal, (ii) multiply a phase error signal by a second factor to generate a multiplied phase error signal, (iii) add said multiplied width error signal and said multiplied phase error signal to generate said control signal, and (iv) separately program said first factor when (a) said width error signal is at a maximum pulse width and (b) said width error signal is at a minimum pulse width;
a counter circuit configured to generate said width error signal in response to said output signal and an input signal; and
a detector circuit configured to generate said phase error signal in response to said output signal and said input signal.

* * * * *